(12) United States Patent
Plourde et al.

(10) Patent No.: US 11,664,772 B2
(45) Date of Patent: May 30, 2023

(54) AMPLIFIER COMPENSATION CIRCUITS AND METHODS

(71) Applicant: Analog Devices, Inc., Wilmington, MA (US)

(72) Inventors: David James Plourde, Pembroke, NH (US); Quan Wan, Belmont, MA (US)

(73) Assignee: Analog Devices, Inc., Wilmington, MA (US)

( * ) Notice: Subject to any disclaimer, the term of this patent is extended or adjusted under 35 U.S.C. 154(b) by 163 days.

(21) Appl. No.: 17/174,070

(22) Filed: Feb. 11, 2021

(65) Prior Publication Data

US 2022/0209721 A1 Jun. 30, 2022

Related U.S. Application Data

(60) Provisional application No. 63/132,298, filed on Dec. 30, 2020.

(51) Int. Cl.
| | |
|---|---|
| *H03F 1/34* | (2006.01) |
| *H03F 1/42* | (2006.01) |
| *H03F 3/45* | (2006.01) |

(52) U.S. Cl.
CPC ........... *H03F 1/42* (2013.01); *H03F 3/45475* (2013.01); *H03F 2200/129* (2013.01); *H03F 2200/36* (2013.01)

(58) Field of Classification Search
CPC ..................................... H03F 1/34; H03F 1/22
(Continued)

(56) References Cited

U.S. PATENT DOCUMENTS

| | | | | |
|---|---|---|---|---|
| 4,993,063 A | * | 2/1991 | Kiko ........................ | H04Q 1/50 379/43 |
| 6,768,380 B2 | | 7/2004 | Hong et al. | |

(Continued)

FOREIGN PATENT DOCUMENTS

| | | |
|---|---|---|
| CN | 109116906 A | 1/2019 |
| CN | 114696755 A | 7/2022 |

OTHER PUBLICATIONS

Franco, Sergio, "Miller Frequency Compensation: How to Use Miller Capacitance for Op-Amp Compensation", All About Circuits, [Online] Retrieved from the Internet: <URL: https://www.allaboutcircuits.com/technical-articles/miller-frequency-compensation/>, (Jun. 12, 2010), 9 pgs.

(Continued)

*Primary Examiner* — Henry Choe
(74) *Attorney, Agent, or Firm* — Schwegman Lundberg & Woessner, P.A.

(57) ABSTRACT

Various examples are directed to a frequency-compensated amplifier circuit comprising a first multi-stage amplifier comprising a first amplifier input node, a first amplifier output node, and a first amplifier intermediate node. A first feedback path between the first amplifier input node and the first amplifier output node comprises a feedback resistance. A second feedback path between the first amplifier output node and the first amplifier intermediate node comprises a first capacitor and a portion of the feedback resistance. A first switch circuit may be electrically coupled to the first capacitor and to the feedback resistance. The first switch circuit may have a first state in which the first capacitor is coupled to a first tap point of the feedback resistance and the portion of the feedback resistance has a first value. The first switch circuit may also have a second state in which the first capacitor is coupled to a second tap point of the feedback (Continued)

resistance and the portion of the feedback resistance has a second value different than the first value.

18 Claims, 11 Drawing Sheets

(58) Field of Classification Search
USPC .................................. 330/99, 98, 103, 293
See application file for complete search history.

(56) References Cited

U.S. PATENT DOCUMENTS

| | | | |
|---|---|---|---|
| 6,975,099 B2 | 12/2005 | Wu et al. | |
| 7,023,271 B1 * | 4/2006 | Aram ...................... | H03F 1/08 |
| | | | 330/99 |
| 7,521,909 B2 | 4/2009 | Dow et al. | |
| 8,169,203 B1 | 5/2012 | Vemula | |
| 8,773,199 B2 * | 7/2014 | Wan .................... | H03F 3/45076 |
| | | | 330/103 |
| 9,086,710 B1 | 7/2015 | Milanesi et al. | |
| 10,224,887 B2 | 3/2019 | Frasch et al. | |
| 2010/0253431 A1 | 10/2010 | Fujiwara | |

OTHER PUBLICATIONS

Genz, Adrian P, "Operational Amplifier Bandwidth Extension Using Negative Capacitance Generation", MS Thesis, Bringham Young University, (Aug. 2006), 79 pgs.

Hinojo, J, et al., "LDO compensation with variable Miller series resistance", Electronics Letters, 50(3), (Jan. 30, 2014), 2 pgs.

Kuphaldt, Tony R, "Chapter 8: Operational Amplifiers—Practical Considerations", Lessons In Electric Circuits, vol. 3, [Online] Retrieved from the Internet: <URL: https://www.allaboutcircuits.com/textbook/semiconductors/chpt-8/op-amp-practical-considerations>, (Retrieved on Feb. 11, 2021), 10 pgs.

Kuphaldt, Tony R, "Chapter 8: Operational Amplifiers—What Is an Instrumentation Amplifier?", Lessons in Electronic Circuits, vol. 3: Semiconductors, [Online] Retrieved from the Internet: <URL: https://www.allaboutcircuits.com/textbook/semiconductors/chpt-8/the-instrumentation-amplifier/>, (Retrieved on Nov. 22, 2020), 4 pgs.

Liu, Jiaming, et al., "Switched-compensation technique in switchedcapacitor circuits for achieving fast settling performance", MS Thesis, Iowa State University, (2015), 63 pgs.

Oljaca, Miroslav, et al., "Operational amplifier gain stability, Part 1: General system analysis", Texas Instruments Analog Applications Journal 1Q, (2010), 6 pgs.

Oljaca, Miroslav, et al., "Operational amplifier gain stability, Part 3: AC gain-error analysis", Texas Instruments Analog Applications Journal 3Q, (2010), 7 pgs.

Surtihadi, Henry, et al., "Operational amplifier gain stability, Part 2: DC gain-error analysis", Texas Instruments Analog Applications Journal Q2, (2010), 7 pgs.

Zaidi, Muhaned, et al., "Programmable bandwidth operational amplifier with negative Miller compensation", IEEE 5th International Electrical Engineering Congress (IEECON), Pattaya, Thailand, (Mar. 8-10, 2017), 4 pgs.

"United Kingdom Application Serial No. 2119089.7, Combined Search and Examination Report dated Jun. 16, 2022", 4 pgs.

"United Kingdom Application Serial No. 2119089.7, Office Action dated Jan. 18, 2022", 2 pgs.

* cited by examiner

AMPLIFIER COMPENSATION CIRCUITS AND METHODS

CLAIM OF PRIORITY

This application claims priority to U.S. Provisional Application Ser. No. 63/132,298, filed Dec. 30, 2020, which is hereby incorporated by reference in its entirety.

TECHNICAL FIELD

This document pertains generally, but not by way of limitation, to amplifier circuits and particularly, but not by way of limitation to amplifier circuits with variable bandwidth compensation.

BACKGROUND

The ability of a voltage feedback amplifier to accurately amplify time-varying signals is limited by the open-loop unity gain bandwidth or gain bandwidth product (GBW) or slew rate of the amplifier. The GBW is the product of the closed loop gain of the amplifier and its bandwidth and is constant. Accordingly, an amplifier configured for a relatively low gain will have a relatively large bandwidth just as an amplifier configured for relatively high gain will have a relatively small bandwidth. The drop in bandwidth due to increased gain can degrade amplifier performances. In some amplifier circuits, gain is configurable. A user may select a desired gain, for example, by varying the size of a gain resistance. In doing so, however, the user may also deleteriously change the amplifier's bandwidth.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
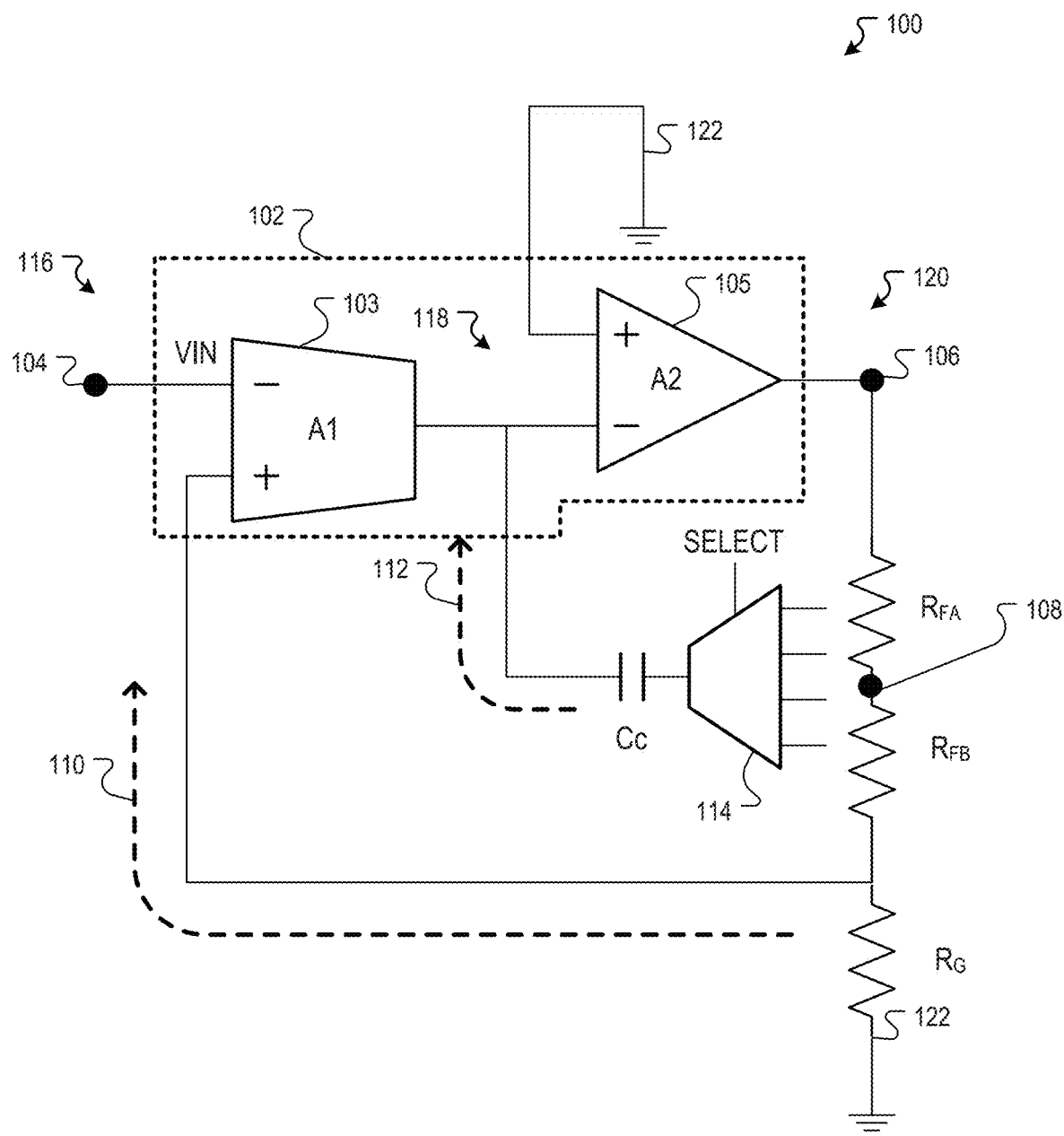
FIG. 1 is a diagram showing one example of a bandwidth-compensated amplifier circuit including a multi-stage amplifier.

Various examples described herein are directed to frequency-compensated amplifier circuits and methods of using frequency-compensated amplifier circuits. An amplifier circuit includes a multi-stage amplifier comprising a first stage and a second stage. An input node of the multi-stage amplifier is at an input of the first stage. An output node of the multi-stage amplifier is at an output of the second stage. An intermediate node of the multi-stage amplifier is between the first stage and the second stage.

The multi-stage amplifier may be arranged with a first feedback path and a second feedback path. The first feedback path is between the output node and the input node and affects the closed-loop gain of the multi-stage amplifier arrangement and includes a feedback resistance electrically coupled between the input node and the output node. A gain resistance may be electrically coupled between the input node and a ground. The closed-loop gain of the multi-stage amplifier arrangement may be based on the values of feedback resistance and gain resistance, as described in more detail herein.

The second feedback path is between the output node and the intermediate node and affects the bandwidth and stability of the multi-stage amplifier arrangement. The second feedback path includes a compensation capacitor and a resistance portion that may include a portion of the feedback resistance and/or the feedback resistance and a portion of the gain resistance. A switch circuit is configured to set the resistance portion that is included in the second feedback path. For example, the feedback resistance may have a first end terminal and a second end terminal, where the full feedback resistance is between the first and second end terminals. The feedback resistance may also have a third terminal coupled to a tap point that can be at various different positions along the feedback resistance. Accordingly, the resistance between the first terminal and the third terminal (or between the second terminal and the third terminal) is a portion of the full feedback resistance, with the resistance of the portion depending on the position of the tap point. The switch circuit positions the third terminal at a selected tap position to set the portion of the feedback resistance that is included in the second feedback path.

The second feedback path, including the compensation capacitor and the portion of the feedback resistance, sets the bandwidth of the multi-stage amplifier, thereby stabilizing the amplifier and also limiting the loss of bandwidth at higher gains. Because of the Miller effect, the capacitance of the compensation capacitor will appear larger than its physical capacitance by a factor related to the gain of the amplifier stage between the intermediate node and the output node and a feedback factor $\beta$ that, as shown herein, may be related to the portion of the feedback resistance in the second feedback path and the gain resistance. By incorporating a portion of the feedback resistance into the second feedback path, the Miller effect becomes adaptive, depending on the closed-loop gain of the multi-stage amplifier arrangement, as described in more detail herein. As a result, the bandwidth of the multi-stage amplifier arrangement also becomes adaptive, thus limiting the loss of bandwidth at higher closed-loop gain values.

Using the switch circuit to vary the portion of the feedback resistance incorporated into the second feedback path may allow even greater bandwidth expansion while maintaining stability. For example, the phase margin of the multi-stage amplifier depends on the closed-loop gain of the multi-stage amplifier circuit as well as the impedance of the second feedback path including the compensation capacitor and the portion of the feedback resistance. Accordingly, if the portion of the feedback resistance included in the second feedback loop is held constant, the compensation capacitor may be selected with a value large enough to bring about a suitably large phase margin across all desirable closed-loop gains. A larger compensation capacitor, however, may lead to reduced bandwidth. Accordingly, making the portion of the feedback resistance in the second feedback loop configurable may allow a smaller compensation capacitance to be used. In this way, Instability (e.g., due to low phase margin) resulting from the lower compensation capacitance may be corrected by varying the portion of the feedback resistance in the second feedback loop. In this way, a lower compensation capacitance may be selected to achieve higher bandwidth while varying the portion of the feedback resistance included in the second feedback loop to achieve suitable stability.

In various examples, the amplifier circuit can also include a control circuit configured to generate a switch select signal that configures the switch circuit to optimize the multi-stage amplifier circuit for different closed-loop gains. For example, the control circuit may receive an indication of a closed-loop gain for the multi-stage amplifier circuit and/or other input as described herein. The indication can be programmed by another component, communicated by another component, sensed by the control circuit, or otherwise determined. Based on the closed-loop gain, the control circuit selects a suitable switch select signal that will configure the switch circuit to switch a portion of the feedback resistance in the second feedback path, where the portion is optimized for the indicated closed-loop gain. In some examples, the portion of the feedback resistance switched into the second feedback path is optimized to maximize the bandwidth of the amplifier circuit for a given gain, for example, while maintaining stability. In other examples, different states of the switch circuit may position the tap of the feedback resistance to provide multiple different bandwidths (e.g., for a given gain).

In some examples, the amplifier circuit includes a control circuit that is configured to vary the bandwidth of the multi-stage amplifier circuit during use by varying the portion of the feedback resistance included in the second feedback path. Consider an example in which the multi-stage amplifier circuit is used to amplify a sensor single generated by a sensor. It may be desirable to power down the amplifier circuit in between samples of the sensor signal. Accordingly, the multi-stage amplifier circuit is powered-up for sampling the sensor signal. In a first time period after power-up, the control circuit configures the switch circuit to bring about a first, wide bandwidth. In a second time period, after start-up transients have settled, the control circuit reconfigures the switch circuit to bring about a second, narrower bandwidth for sampling the sensor signal. The wider bandwidth during the first period may cause start-up transients to settle faster, meaning that it may not be necessary to wait as long after power-up before sampling the sensor signal. This may reduce power consumption as the amplifier circuit may not need to be powered on as long as it would at a single bandwidth. The narrower bandwidth during the second period may also tend to lower wideband noise during measurement.

FIG. 1 is a diagram showing one example of a bandwidth-compensated amplifier circuit 100 including a multi-stage amplifier 102. The multi-stage amplifier 102 comprises a stage 103 and a stage 105. The stage 103 includes an input node 116. In this example, the stage 103 is a differential stage and the input node comprises an inverting input of the stage 103 (indicated by "−") and a non-inverting input of the stage 103 (indicated by "+"). An intermediate node 118 is between the stage 103 and the stage 105. The intermediate node in this example includes an output of the stage 103 and the one or more inputs of the stage 105. In this example, the stage 105 is also a differential stage and the intermediate node 118 includes an output of the stage 103, an inverting input of the stage 105 (indicated by "−") and a non-inverting input of the stage 105 (indicated by "+"). An output node 120 includes an output of the stage 105.

The amplifier circuit 100 is arranged in a non-inverting configuration. An input signal 104 is provided at the stage 103 inverting input at the input node 116. An output of the stage 103 is provided to the stage 105 inverting input. An output signal 106 is at the output of the stage 105. The stage 105 non-inverting input is electrically coupled to ground 122. A first feedback path 110 is shown between the output node 120 and the input node 116. In this example, the first feedback path 110 is electrically coupled between the stage 105 output and the stage 103 non-inverting input. The first feedback path 110 comprises a feedback resistance $R_F$ that is indicated in FIG. 1 by two constituent portions, $R_{FA}$ and $R_{FB}$. The two portions of $R_F$, in this example, are arranged in series such that the total feedback resistance is the sum of the resistances $R_{FA}$ and $R_{FB}$. The first feedback path 110 provides a feedback signal at the input node 116 that is derived from the output node 120, based on the feedback resistance $R_F$ and the gain resistance $R_G$.

The amplifier 100 also includes a second feedback path 112 electrically coupled between the output node 120 and the intermediate node 118. The second feedback path 112 includes a compensation capacitor Cc and the portion of the feedback resistance $R_F$. The second feedback path 112 provides a feedback signal at the intermediate node 118 that is derived from the output node 120, based on the compensation capacitor Cc and the portion $R_{FA}$ of the feedback resistance $R_F$ and the gain resistance $R_G$. For example, the feedback factor β of the second feedback path 112 may depend on the feedback resistance $R_F$ (including $R_{FA}$ and $R_{FB}$) and the gain resistance $R_G$ as indicated by Equation [9] below.

In FIG. 1, the portion of the feedback resistance included in the second feedback path 112 is indicated by $R_{FA}$ and the portion of the feedback resistance not included in the second feedback path is indicated by $R_{FB}$. A switch circuit 114 is coupled to select the portions $R_{FA}$ and $R_{FB}$ of the feedback resistance $R_F$. For example, the feedback resistance $R_F$ may comprise a tap point 108. The portion $R_{FA}$ may be the portion of feedback resistance $R_F$ between the output node 106 and the switch circuit 114 while the portion $R_{FB}$ may be the portion of the feedback resistance $R_F$ between the switch circuit 114 and the gain resistance $R_G$.

The switch circuit 114 may be configured with different states corresponding to different positions of the tap point 108 along the feedback resistance $R_F$. Different states of the switch circuit 114 may correlate to different positions of the tap point 108 along the feedback resistance feedback resistance $R_F$. For example, the switch circuit 114 may be configured in a state that positions the tap point 108 at closer to the gain resistance $R_G$ to increase the resistance of the portion $R_{FA}$ and decrease the resistance of the portion $R_{FB}$. Similarly, the switch circuit 114 may be configured in a different state that positions the tap point 108 closer to the output node 120 to decrease the resistance of the portion $R_{FA}$ and increase the resistance of the portion $R_{FB}$. The state of the switch circuit 114 may be selectable with a select signal (indicated in FIG. 1 by SELECT), where the value of the switch select signal determines the state of the switch circuit.

The switch circuit 114 and tap point 108 may be implemented in any suitable manner. In some examples, the switch circuit 114 is or comprises a multiplexer or mux. The mux may comprise an output coupled to the compensation capacitor Cc and a plurality of inputs electrically coupled to different positions on the feedback resistance $R_F$. The value of the switch select signal configures the mux to electrically couple the compensation capacitor Cc to one of the positions on the feedback resistance $R_F$. The position to which the compensation capacitor Cc is electrically coupled, then, is the tap point 108 and its position on the feedback resistance $R_F$ determines the resistance of the portions $R_{FA}$ and $R_{FB}$. In another example, the switch circuit 114 comprise a wiper contact that is electrically coupled to the compensation capacitor Cc and to the feedback resistance $R_F$. The tap point 108 is the position at which the wiper contact is electrically coupled to the feedback resistance $R_F$. Other switching arrangements could also be used in addition to or instead of these.

The closed-loop gain of the amplifier circuit 100 is determined by the feedback resistance $R_F$ and the gain resistance $R_G$, which is electrically coupled between the feedback resistance $R_F$ and ground 122. The amount of signal feedback between the output node 120 and the input node 116 may be set by the feedback resistance $R_F$ (e.g., $R_{FA}+R_{FB}$) and the gain resistance $R_G$, for example, as given by Equation [1]:

$$\text{Signal Feedback} = \frac{R_G}{R_F + R_G} \quad [1]$$

The closed loop gain of the amplifier circuit 100 in the non-inverting configuration shown in FIG. 1, then, may be given by Equation [2]:

$$\text{Gain} = \frac{R_G + R_F}{R_G} \quad [2]$$

In examples where the amplifier circuit 100 is arranged in an inverting configuration (e.g., input 104 provided at the input of the stage 103 inverting input), the gain would be as given b Equation [3]:

$$\text{Gain} = -\frac{R_F}{R_G} \quad [3]$$

The second feedback path 112 may function as an adaptive Miller compensation circuit, where the Miller effect changes the effective capacitance of the compensation capacitor Cc based on the closed loop gain of the amplifier circuit 100. The Miller effect may adjust the effective capacitance of the compensation capacitor Cc by a factor given by Equation [4] below:

$$MF = 1 - \frac{R_{FA}}{R_{FA} + R_{FB} + R_G} \quad [4]$$

Miller effect changes to the effective capacitance of the compensation capacitor Cc may cause the closed-loop 3 dB bandwidth of the amplifier circuit 100 to be increased by a factor given by Equation [5] below:

$$BE = \frac{1 + A_2}{1 + \left(1 + \frac{R_{FB}}{R_G}\right) A_2 \beta 1} \quad [5]$$

In Equation [5], $A_2$ is the gain between the intermediate node 118 and the output node 120 of the multi-stage amplifier 102. $\beta 1$ is the feedback coefficient of the first feedback path 110.

Figure 5:
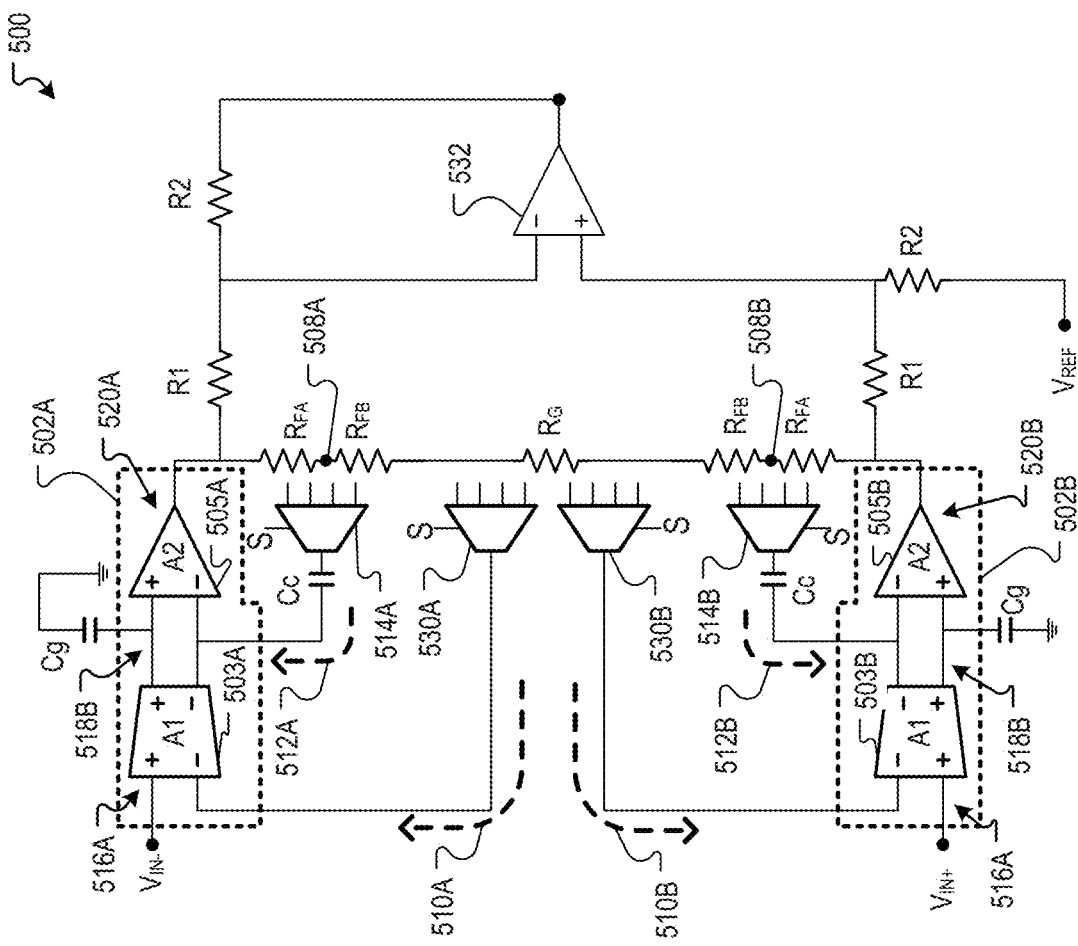
FIG. 5 is a diagram showing one example of an instrumentation amplifier circuit utilizing bandwidth compensation as described herein.
Figure 6:
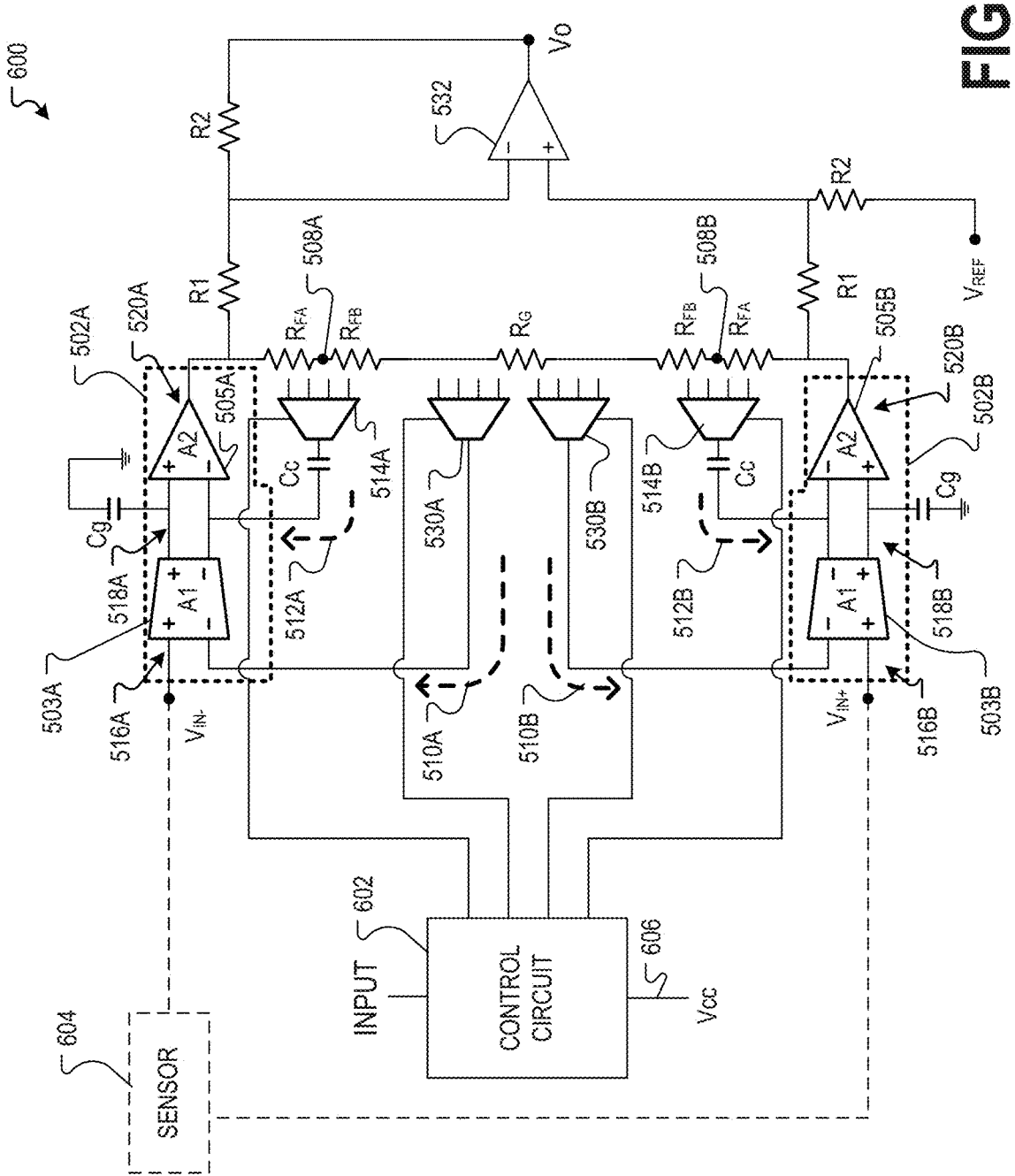
FIG. 6 is a diagram showing one example of an instrumentation amplifier circuit utilizing bandwidth compensation utilizing the arrangement of FIG. 5.

In some examples, the switch circuit 114 is configured to position the tap point 108 along the gain resistance $R_G$. In this example, the second feedback path 112 would include all of the feedback resistance $R_F$ and a portion of the gain resistance $R_G$. The bandwidth extension of such an arrangement would be given by Equation [6], where $R_{GA}$ is the portion of the gain resistance $R_G$ that is part of the second feedback path 112 and $R_{GB}$ is the portion of the gain resistance $R_G$ outside of the second feedback path 112. In some examples, the values of $R_{GA}$ and $R_{GB}$ may be variable utilizing a switch circuit similar to the switch circuit 114. An example of such an arrangement is shown in FIGS. 5 and 6 with the switch circuits 530A, 530B.

$$BE = \frac{1 + A_2}{1 + \left(1 + \frac{R_{GB}}{R_{GB} + R_{GA}}\right) A_2 \beta 1} \quad [6]$$

Figure 2:
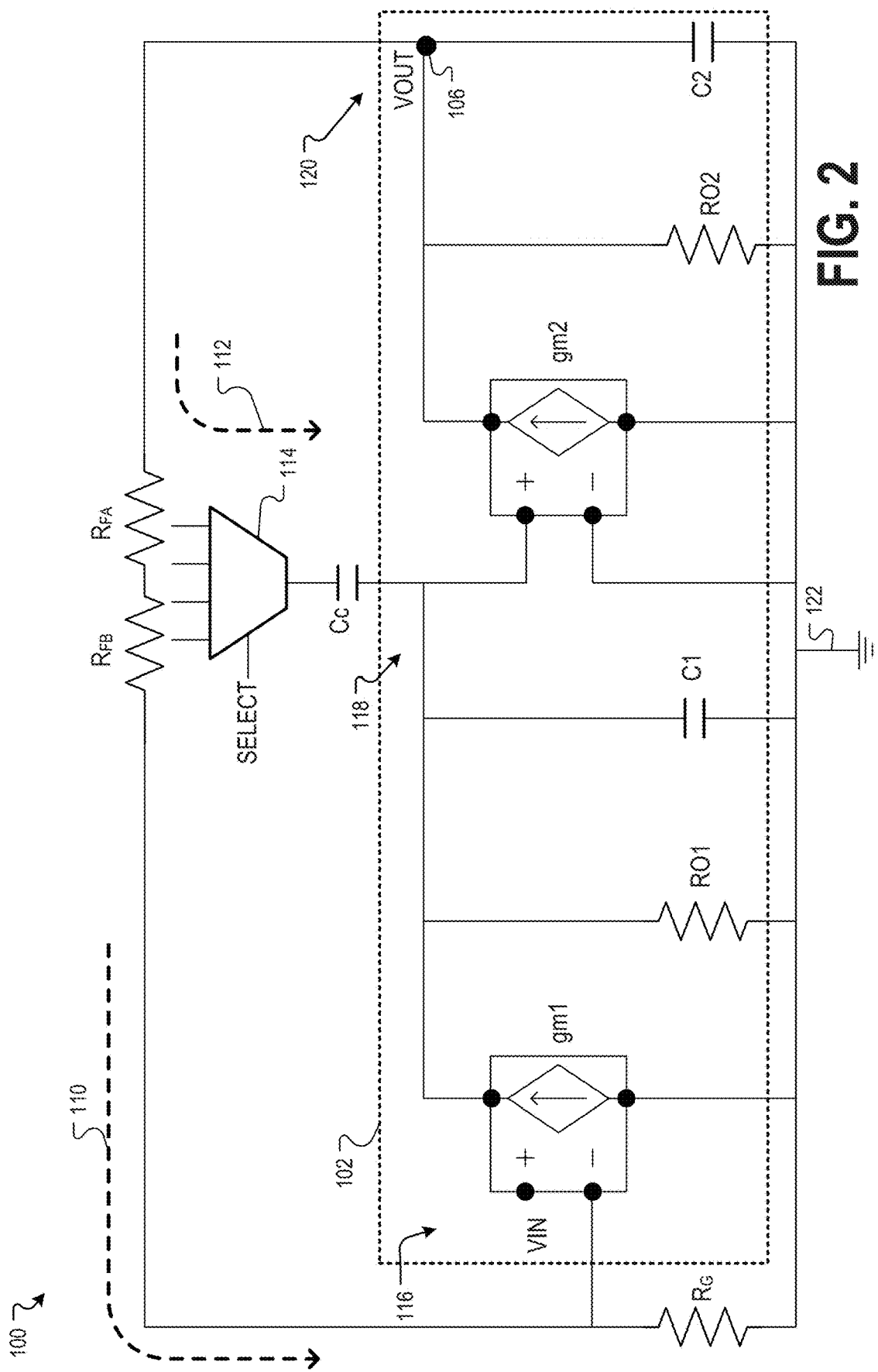
FIG. 2 is a diagram showing one example of a small signal model of the amplifier circuit of FIG. 1.

FIG. 2 is a diagram showing one example of a small signal model of the amplifier circuit 100 of FIG. 1. In the example of FIG. 2, the multi-stage amplifier 102 has a single-ended first stage gm1, but one of skill in the art will recognize that the discussion herein may also apply to a differential first stage. Further, any voltage feedback amplifiers configures using either non-inverting operation or inverting operation (such as, for example, an input amplifier of a three operational-amplifier instrumentation amplifier described herein). A single output stage gm2 is shown. The current disclosure, however, is not limited to any particular number of amplification and/or output stages. Because the output stage gm2 reverses signal polarity, the inverting and non-inverting nodes of the first stage gm1 correspond to the inverting and non-inverting inputs of the feedback amplifier, respectively.

An analysis of the benefits of the compensation technique in accordance with the instant disclosure follows. For simplicity, this analysis assumes that the feedback amplifiers do not drive large-value external capacitances. It is also assumed that the amplifier's internal parasitic capacitances (shown as C1 and C2 in FIG. 2) are much less than the compensation capacitor Cc and, accordingly, consideration of the internal parasitic capacitances C1 and C2 is omitted. One of skill in the art, however, will understand that these assumptions are used to explain the concepts below more clearly and that the present disclosure may be used in circuits driving large capacitances and/or using amplifiers having non-negligible internal parasitic capacitances, or otherwise deviating from the assumptions inherent in the equations herein.

In the example arrangement of FIG. 2, the loop gain at direct current (DC) is given by the product of A1, A2, and β, where A1 is the gain between the input node 116 and the intermediate node 118. The values for A1, A2, and β are given by Equations [7], [8], and [9] below:

$$A1 = g_{m1}r_{o1} \quad [7]$$

$$A2 = g_{m2}r_{o2} \quad [8]$$

$$\beta 2 = \left(1 + \frac{R_{FB}}{R_G}\right) \times \frac{R_G}{R_{F+R_G}} \quad [9]$$

In Equations [7] and [8], $g_{m1}$ and $g_{m2}$ are the transconductances of the stages gm1 and gm2 while $r_{o1}$ and $r_{o2}$ are the output impedances of the stages gm1 and gm2 (indicated at FIG. 2 by RO1 and RO2). β2 is the feedback coefficient of the feedback path 112. The equivalent capacitance produced by the compensation capacitor Cc is, due to the Miller effect, greater than Cc and is given by Equation [10];

$$C_{eq} = (1+k)C_C \quad [10]$$

In Equation [10], k is the voltage gain across the compensation capacitor Cc.

The Miller effect causes a capacitance at a first terminal of a capacitor to appear large than it actually is if a voltage at the second terminal of the capacitor is changing in a direction opposite to that of the first terminal. Based on the value of the equivalent capacitance, the transfer function of the loop gain has a dominant pole $f_o$ and a unity gain bandwidth $f_u$ given by Equations [11] and [12]:

$$f_o = \frac{1}{2\pi r_{o1}(1+k)C_C} \quad [11]$$

$$f_u = A1A2\beta 1. \quad [14]$$

Substituting this value for k into Equations [11] and [13] shows a dominant pole $f_o$ and closed-loop 3 dB bandwidth $f_c$ as given by Equations [15] and [16]:

$$f_o = \frac{1}{2\pi r_{o1}(1+A2\beta 2)C_C} \quad [15]$$

$$f_c = A1A2\beta 1 \cdot \frac{1}{2\pi r_{O1}(1+A2\beta 2)C_C} \quad [16]$$

Thus, the added dependence on the feedback coefficient β increases the bandwidth of the amplifier circuit 100 relative to circuits that omit the second feedback path 112. Further, as given by Equation [8] above, varying the resistance of the portion of the feedback resistance $R_F$ that is included in the second feedback path also varies the bandwidth of the amplifier circuit 100.

The amplifier circuit 100 in the arrangement shown in FIG. 1 may provide certain benefits with respect to bandwidth and stability. For example, lower values of the compensation capacitance Cc may correspond to higher bandwidth values. Consider an example in which the portions $R_{FA}$ and $R_{FB}$ of the feedback resistance $R_F$ are fixed (e.g., switch circuit 114 is omitted) and the gain is programmable (e.g., $R_G$ is selectable and/or modifiable with a switch circuit). In this arrangement, the compensation capacitance Cc may be selected at a value large enough to make the amplifier circuit 100 stable at the highest anticipated gain set by $R_G$. Recall from Equations [15] and [16] above, however, that higher values of the compensation capacitance Cc correspond to lower bandwidths. Accordingly, the trade-off for stability at high gains may be lower bandwidth at lower gains.

Utilizing the arrangement of FIG. 1, with the switch circuit 114 to modify the values of the feedback resistance portions $R_{FA}$ and $R_{FB}$ provides another way to vary the bandwidth of the amplifier circuit 100 (e.g., other than varying the compensation capacitance Cc). This may allow a smaller value of Cc to be chosen. At high gain, stability may be achieved by selecting the values of the feedback resistance portions $R_{FA}$ and $R_{FB}$ to reduce bandwidth given the lower value at Cc. At lower gains, the lower value of Cc may allow wider bandwidth.

Figure 3:
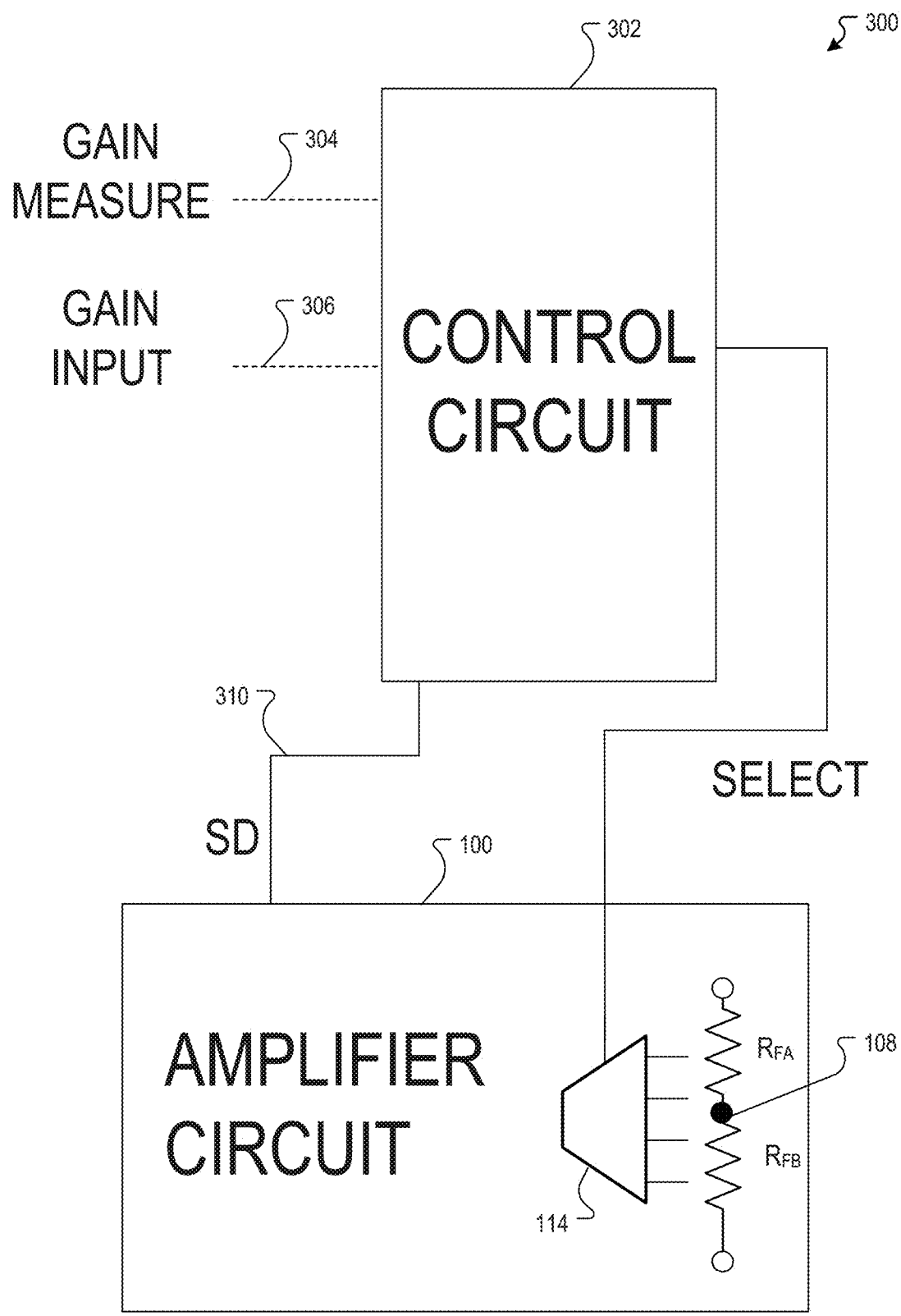
FIG. 3 is a diagram showing one example arrangement of the multi-stage amplifier circuit of FIGS. 1 and 2 in communication with a control circuit for providing the switch select signal to the switching circuit for modifying the bandwidth of the amplifier circuit.

FIG. 3 is a diagram 300 showing one example arrangement of the multi-stage amplifier circuit 100 of FIGS. 1 and 2 in communication with a control circuit 302 for providing the switch select signal (SELECT) to the switching circuit 114 for modifying the bandwidth of the amplifier circuit 100. In the example of FIG. 3, the switch circuit 114 is a mux and the switch select signal is an input to the mux selecting a mux input. The mux input determines the position of the tap point 108 on the feedback resistance $R_F$ and, thus, the values of $R_{FA}$ and $R_{FB}$. Any suitable switch arrangement or mechanism for setting the values of $R_{FA}$ and $R_{FB}$ may be used, however.

The control circuit 302 shows two example inputs, a gain measure input 304, a gain input 306. The control circuit 302 may include any combination of inputs 304, 306 or other inputs not shown in FIG. 3.

The gain measure input 304 receives a measure of the gain (e.g., the closed-loop gain of the amplifier circuit 100). The measure of the gain may be provided by another component, such as a processor or sensor, and/or measured by the control circuit. For example, the gain measure input 304 may be or be based on a voltage and/or current at the amplifier circuit 100. The control circuit 302 may measure the voltage or other value in the amplifier circuit 100 to derive a corresponding gain.

The gain input 306 receives a signal indicating a gain for the amplifier circuit 100. For example, the amplifier circuit 100 may have a programmable gain. The gain input 306 may receive an indication of the gain to be programmed to the amplifier circuit 100. In some examples, the control circuit 302 is configured to also set a gain for the amplifier circuit 100, for example, as described herein with respect to FIGS. 5 and 6.

Another example way to provide an input to the control circuit 302 is via pinstrapping. Pinstrapping may involve tying one or more pins of an integrated circuit including the control circuit 302 to a particular voltage, such as ground or a power supply voltage Vcc. The pinstrapping configuration indicates a desired bandwidth or gain to the control circuit 302. In some examples, tying a designated pin or pins to ground may indicate a low bandwidth with corresponding values of the feedback resistance portions $R_{FA}$ and $R_{FB}$. Tying a designated pin or pins to the power supply voltage Vcc may indicate a higher bandwidth, again with corresponding values of the feedback resistance portions $R_{FA}$ and $R_{FB}$.

The control circuit 302 may comprise any suitable hardware or software for determining the switch select signal for the switch circuit 114 based on one or more of the inputs 304, 306. For example, the control circuit 302 may include one or more logic gates, flip flops, or other logical components to convert one or more of the inputs 304, 306 to corresponding switch select signals to the switch circuit 114.

In some examples, the control circuit 302 also provides a signal to a shut down or sleep input (SD) 310 of the amplifier circuit 100. The SD input 310, when asserted, may cause the amplifier circuit to enter a sleep or shut down mode in which power consumption is reduced. In this way, the control circuit 302 may selectively shut-down or power-up the amplifier circuit 100, for example, as described herein with respect to the process flow of FIG. 7. It will be appreciated that the logic of the SD input 310 may be arranged in any suitable way. In some examples, providing a "high" voltage to the SD input 310 causes the amplifier circuit 100 to enter a shut down state while providing a "low" voltage causes the amplifier circuit 100 to enter a powered-up or operational state. In other examples, providing a "low" voltage to the SD input 310 causes the amplifier circuit 100 to enter the shut down state while providing a "high" voltage causes the amplifier circuit 100 to enter the powered-up or operational state. Other arrangements are also contemplated.

Figure 4:
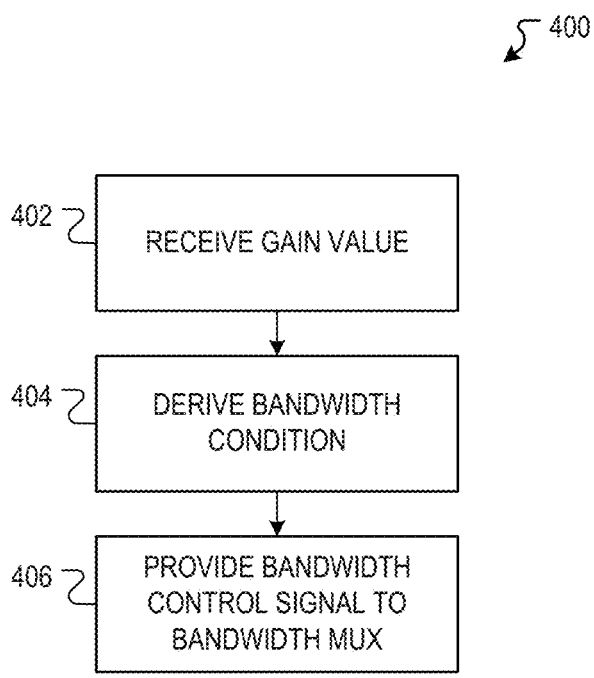
FIG. 4 is a flowchart showing one example of a process flow that can be executed by the control circuit to configure the bandwidth of an amplifier circuit, such as the amplifier circuit of FIGS. 1-3.

FIG. 4 is a flowchart showing one example of a process flow 400 that can be executed by the control circuit 302 to configure the bandwidth of an amplifier circuit, such as the amplifier circuit 100 of FIGS. 1-3. At operation 402, the control circuit 302 receives a gain value indicating a gain of the amplifier circuit 100. The gain value can be measured (e.g., gain measure input 304) or received via a gain input 306 as described herein.

At operation 404, the control circuit 302 derives a bandwidth condition for the gain value indicated at operation 402. The bandwidth condition may indicate a desired bandwidth for the amplifier circuit. In some examples, the bandwidth condition is or includes a value for the portions of the feedback resistance $R_{FA}$ and $R_{FB}$. In other examples, the bandwidth condition is or includes a value for the switch select signal provided to the switch circuit 114. In some examples, the control circuit 302 determines a bandwidth condition that is optimized for a selected gain. For example, the control circuit 302 may be configured to configure the amplifier circuit 100 for the highest bandwidth that provides suitable stability for a given gain. At operation 406, the control circuit 302 provides a switch select signal to the switch circuit 114 to implement the bandwidth condition determined at operation 404.

FIG. 5 is a diagram showing one example of an instrumentation amplifier circuit 500 utilizing bandwidth compensation as described herein. The amplifier circuit 500 comprises a first multi-stage amplifier 502A and a second multi-stage amplifier 502B. The amplifiers 502A, 502B comprise respective stages 503A, 503B and stages 505A, 505B. The stages 503A, 503B include input nodes 516A, 516B and are differential stages comprising inverting inputs, non-inverting inputs, inverting outputs and non-inverting outputs. Intermediate nodes 518A, 518B are between the stages 503A, 503B and the stages 505A, 505B. In this example, the non-inverting outputs of the stages 503A, 503B are electrically coupled to the non-inverting input of the stages 505A, 505B and to ground via respective capacitors Cg. The inverting outputs of the stages 503A, 503B are electrically coupled to the inverting inputs of the stages 505A, 505B. Outputs of the respective stages 503A, 503B are at output nodes 520A, 520B.

The amplifiers 502A, 502B are coupled with respective first feedback paths 510A, 510B and second feedback paths 512A, 512B. The first feedback paths 510A, 510B are between the respective output nodes 520A, 520B and the respective input nodes 516A, 516B as shown. In this example, the first feedback paths 510A, 510B are between the outputs of the stages 505A, 505B and the respective inverting inputs of the stages 503A, 503B. Both of the first feedback paths 510A include respective feedback resistances $R_F$ that each include two portions, $R_{FA}$ and a second portion $R_{FB}$. The two portions of $R_F$, in this example, are arranged in series such that the total feedback resistance $R_F$ is the sum of the resistances $R_{FA}$ and $R_{FB}$.

The second feedback paths 512A, 512B are electrically coupled between the respective output nodes 520A, 520B and the respective intermediate nodes 518A, 518B. The second feedback paths 512A, 512B include respective compensation capacitors Cc and portions $R_{FA}$ of the feedback resistances $R_F$. Switch circuits 514A, 514B set the value of the portions $R_{FA}$ and $R_{FB}$ of the feedback resistance $R_F$ by positioning respective tap points 508A, 508B on the feedback resistance $R_F$ in response to a switch select signal (indicated in FIG. 5 by "S").

The closed-loop gain of the amplifiers 502A, 502B may be determined by a gain resistances $R_G$ and the feedback resistance $R_{FA}$ and $R_{FB}$, as described herein. The gain resistance $R_G$ is electrically coupled between the respective feedback resistances $R_F$ as shown. In some examples, the circuit 500 may be arranged in a chip or other packaging such that a designer can add an external gain resistance $R_G$. In the example of FIG. 5, additional gain switch circuits 530A, 530B are provided to selectively couple portions of the gain resistance $R_G$ into the respective first feedback paths 510A, 510B to affect the closed loop gain of the amplifier circuit 500. Gain switch circuits 530A, 530B may be implemented in any suitable manner, for example, as described herein with respect to switch circuits 114, 514A, 514B. Select signals for the switch circuits may be provided by a externally and/or determined by a control circuit as described herein.

In the example of FIG. 5, the amplifiers 502A, 502B collectively form a first stage. The gain of the first stage is given by Equation [17] below:

$$\text{Gain (1st stage)} = 1 + \frac{2R_F}{R_{Gactual}} \qquad [17]$$

In Equation [17], $R_F$ is the sum of the feedback resistance portions $R_{FA}$ and $R_{FB}$. $R_{Gactual}$ is the portion of the gain resistance $R_G$ switched into the respective feedback paths 510A, 510B vias the switch circuits 530A, 530B.

An additional amplifier 532 provides an output stage. The closed-loop gain of the output stage may be determined by resistors R1, R2 and R3, for example, as given by Equation 18 below:

$$\text{Gain (2nd stage)} = 1 + \frac{R2}{R1} \qquad [18]$$

In some examples, R1 may be equal to R2 such that the gain of the second stage including the amplifier 532 is unity with the differential gain of the first stage given by Equation [17].

In some examples, the arrangement of FIG. 5 may omit the output stage including the amplifier 532 and resistors R1, R2. Instead, the output nodes 520A, 520B may be electrically coupled to provide the outputs of the respective multi-stage amplifiers 502A, 502B to another component or components. For example, the output nodes 502A, 502B may be electrically coupled to an analog-to-digital converter (ADC) or other suitable component or components.

FIG. 6 is a diagram showing one example of an instrumentation amplifier circuit 600 utilizing bandwidth compensation utilizing the arrangement of FIG. 5. FIG. 6 also shows an example sensor 604 coupled to the inverting input ($V_{IN+}$) and non-inverting inputs ($V_{IN-}$) of the amplifier circuit 600. The sensor 604 may be any suitable sensor including, for example, a temperature sensor, an optical sensor, a Wheatstone bridge sensor, etc. In some examples the sensor 604 measures a biopotential. For example, the sensor 604 may include electrodes that are attached to a human or other type of animal body. The input to the amplifier circuit 600 may be or be derived from the electrodes.

Also, in the example of FIG. 6, switch select signals of the switch circuits 514A, 514B and 530A, 530B are coupled to a control circuit 602. The control circuit 602 may be arranged in a manner similar to that of the control circuit 302 of FIG. 3. The control circuit 602 may be configured to provide a switch select signal to the switch circuits 514A, 514B to determine the portions $R_{FA}$ and $R_{FB}$ of the feedback resistances $R_F$ that are included in the respective second feedback paths 512A, 512B. The control circuit 602 may also be coupled to provide switch select signals to the switching circuits 530A, 530B to set the gain of the first stage including the amplifiers 502A, 502B. In some examples, the control circuit 602 also receives a power supply voltage 606 that may be selectively provided to the amplifier circuit 600 to power-up or power-down the amplifier circuit 600.

The control circuit 602 comprises one or more inputs (INPUT) for instructing the control circuit 602 on how to set the gain and/or bandwidth of the instrumentation amplifier arrangement. In some examples, the input comprises an indication of a desired gain. The control circuit 602 may determine the switch select signals for the switch circuits 530A, 530B based on the INPUT to set the gain of the amplifier circuit 600. The control circuit may also determine the switch select signals for the switch circuits 514A, 514B based on the desired gain, as described herein, to set the bandwidth of the amplifier circuit 600.

Figure 7:
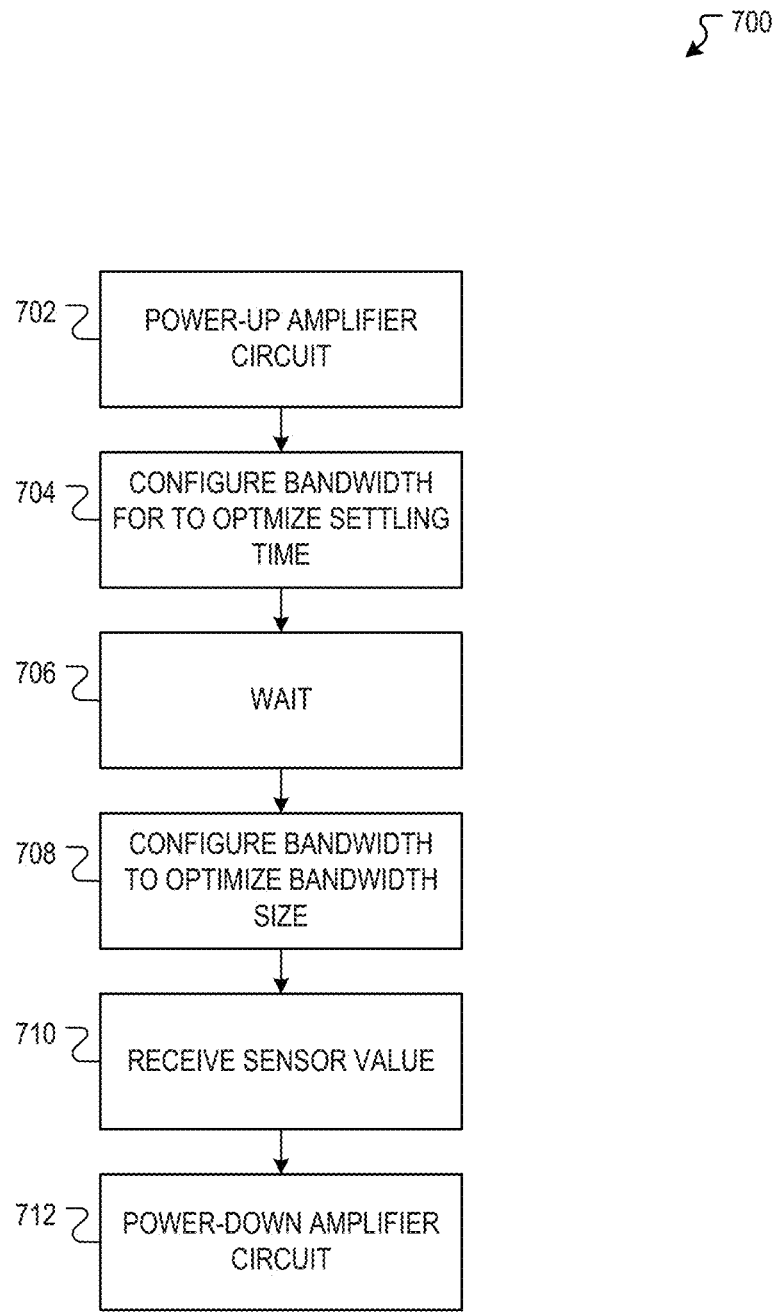
FIG. 7 is a flowchart showing one example of a process flow that may be executed using an amplifier circuit coupled to receive a sensor input signal from a sensor.

FIG. 7 is a flowchart showing one example of a process flow 700 that may be executed using an amplifier circuit coupled to receive a sensor input signal from a sensor. Any of the amplifier circuits described herein may be used to execute the process flow 700. The process flow 700 may begin with the amplifier circuit in a powered-down state. In some examples, a power supply voltage Vcc is removed from the amplifier while it is in the powered-down state. In other examples, the amplifier circuit supports a shut down or sleep state where the power supply voltage is provided, but power consumption is reduced. As described herein, such a state may be induced by providing an appropriate signal at a shut down or sleep input of the amplifier circuit, such as the SD input 310 of FIG. 3.

At operation 702, the control circuit powers-up the amplifier circuit. In examples where the amplifier circuit is powered-down by removing the supply voltage, powering-up the amplifier circuit can include applying the power supply voltage. In examples in which the control circuit powers-down the amplifier circuit by providing a signal at a shut down or sleep input, powering-up the amplifier circuit can include providing a signal at the shut down or sleep input that causes the amplifier circuit to enter a powered-up or operational mode.

Upon powering up the amplifier circuit, certain transient signals may tend to be generated by the sensor, amplifiers, capacitances, inductances, or other circuit components. In certain examples, the output of the amplifier circuit may not provide an accurate representation of the sensor while transients are present. At operation 704, the control circuit configures the amplifier to have a first bandwidth. The control circuit may modify the bandwidth of the amplifier circuit, for example, as described herein. The first bandwidth may be a wide bandwidth selected to allow transient signals to decay quickly. In some examples, the first bandwidth may be optimized to minimize the settling time of the transients. For example, the first bandwidth may be too wide to be optimized for measuring a sensor output signal of the sensor. For example, the first bandwidth may be achieved by sacrificing the phase margin of the amplifier circuit. In some examples, the order of operations 702 and 704 may be switched. The control circuit may configure the amplifier to have the first bandwidth before the amplifier circuit is powered-up. In some examples, first bandwidth may be a default bandwidth that the control circuit configures upon power-up.

At operation 706, the control circuit may wait. The amount of time that the circuit waits may be based on an expected decay time for the transient signals. In some examples, the control circuit monitors the output of the amplifier circuit and waits until the output no longer shows artifacts resulting from the transients.

At operation 708, the control circuit configures the bandwidth of the amplifier circuit to a second bandwidth. The second bandwidth may be smaller than the first bandwidth and may optimize the bandwidth and noise of the circuit for use with the sensor. At operation 710, the amplifier circuit receives the sensor signal as input and provides an output indicating an amplified sensor signal. In some examples, the output of the amplifier circuit is sampled and stored or otherwise processed. At operation 712, the control circuit powers-down the amplifier circuit. This can include, for example, removing the power supply from the amplifier circuit and/or providing an appropriate signal at a shut down or sleep input, as described herein. The power-down at operation 712 may occur after the output of the amplifier circuit has been sampled.

It will be appreciated that the process flow 700, or portions thereof, may be repeated. For example, the control circuit may execute the process flow 700 at a suitable periodic interval to capture periodic readings from the sensor. Any suitable period may be used including, one sample per millisecond, one sample per second, one sample per five minutes, one sample per hour, etc. In other examples, the process flow 700 may be executed on demand. For example, the amplifier circuit may be used in conjunction with a process flow that calls for sampling of the sensor upon the occurrence of a condition. When the condition occurs, the control circuit executes the process flow 700. In some examples, the control circuit tests the condition and executes the process flow 700 when the condition is detected. In other examples, the condition is tested by a separate processor or computing device hardware architecture, such as the architecture 1000 described with respect to FIG. 10. The separate processor instructs the control circuit to execute the process flow 700 when the condition is detected.

Because the first bandwidth is broader than the second bandwidth, operating the amplifier circuit according to the process flow 700 may shorten the total time that the amplifier circuit is powered on. For example, if the amplifier circuit were operated at the second bandwidth only, the circuit may need to be powered on longer in order to allow transients to settle before the output of the amplifier circuit is sampled. Also, in some examples, operating the amplifier in the manner described with respect to FIG. 7 may allow the sensor signal to be captured at a narrower bandwidth that may tend to reduce high bandwidth noise. For example, absent the bandwidth changes described in the process flow 700, a designer may be prompted to select a bandwidth for the amplifier circuit based on a compromise between transient settling time and high-bandwidth noise in the sensor signal. Using the process flow 700 may allow the circuit to select a bandwidth suitable for a low settling time during power-up (operations 704 and 706) and a different bandwidth suitable for low-noise sensor operation (operation 708 and 710).

Figure 8:
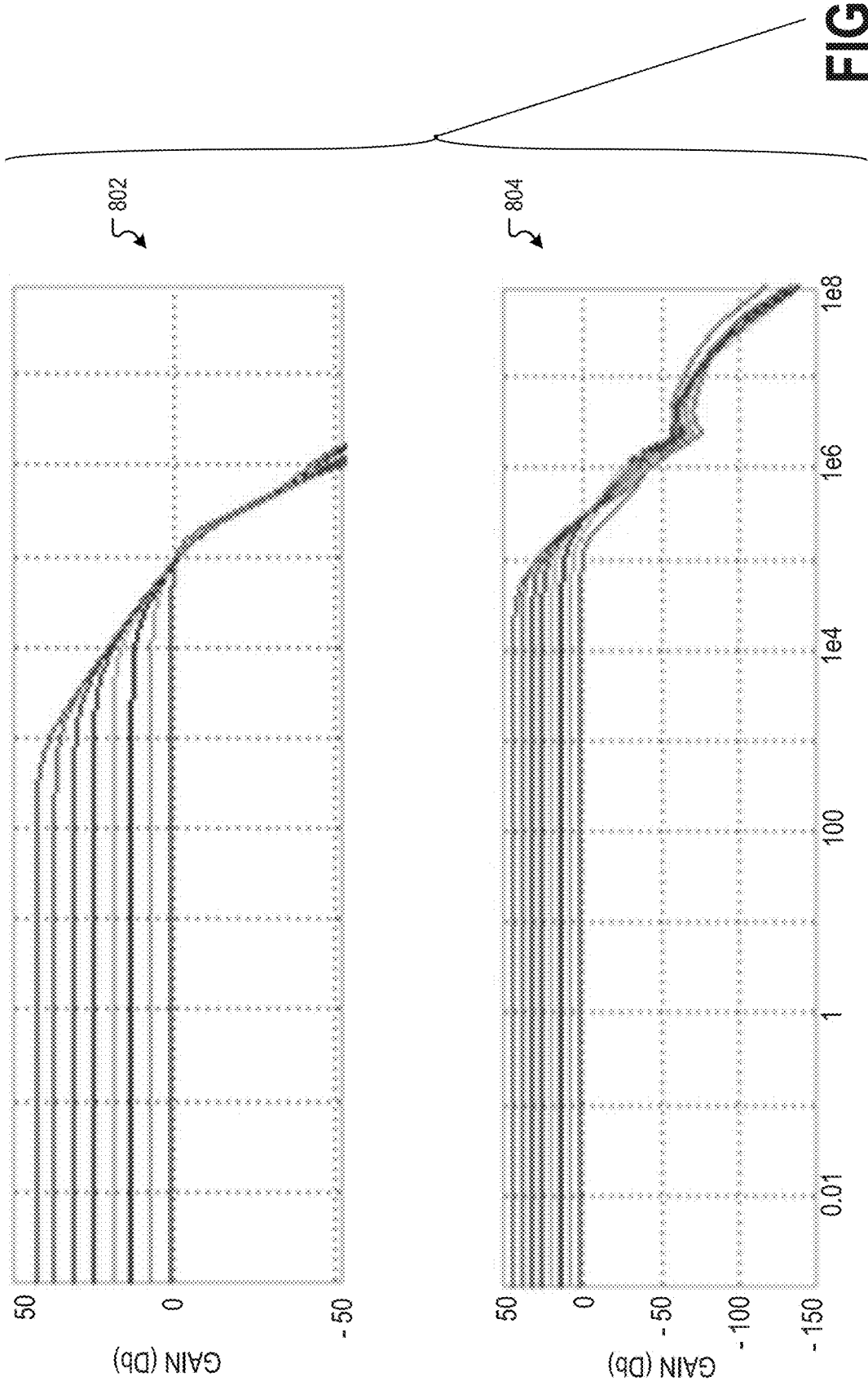
FIG. 8 shows two plots indicating bandwidth versus gain for example amplifier circuits.

FIG. 8 shows two plots 802 and 804 indicating bandwidth versus gain for example amplifier circuits. The plot 802 shows bandwidths and gains for amplifier circuits similar to the circuits 500 of FIG. 5 but arranged with the compensation capacitor electrically coupled to the output stage 120. In this arrangement, no portion of the feedback resistance $R_F$ is in the second feedback path. The second plot 804 shows bandwidths and gains for the amplifier circuit 500 of FIG. 5. As shown, the bandwidths and gains of the plot 802 follow the conventional arrangement with constant GBW. Modifying the portion of the portion of the feedback resistance $R_F$ included in the second feedback path, illustrated by the plot 804, optimizes bandwidth and stability for different gains. As shown in FIG. 8, the arrangement of FIG. 5 provides superior bandwidth (plot 804) versus the comparison amplifier circuit (plot 802).

Figure 9:
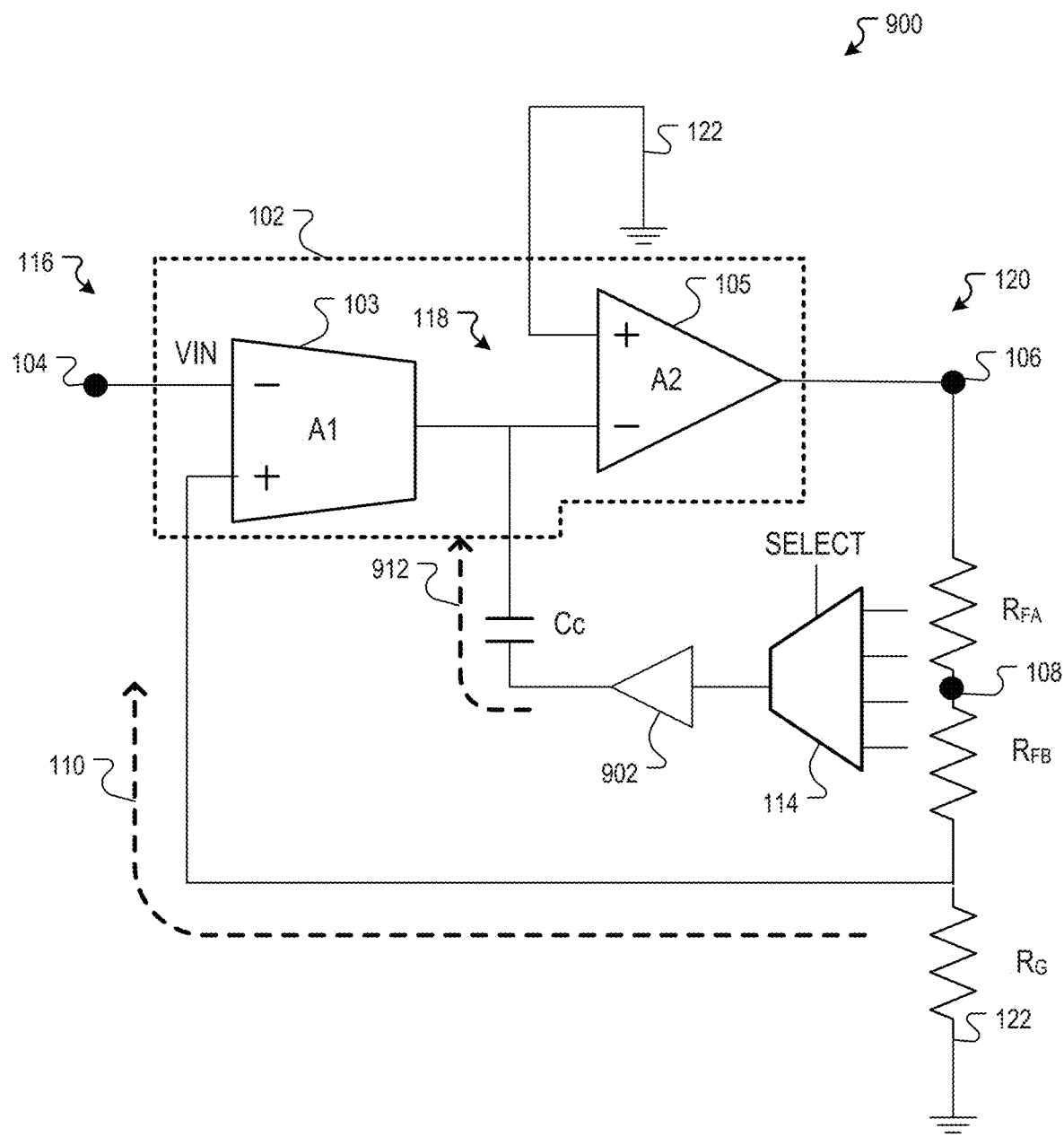
FIG. 9 is a diagram showing one example of a bandwidth-compensated amplifier circuit including buffering of a compensation capacitor.

FIG. 9 is a diagram showing one example of a bandwidth-compensated amplifier circuit 900 including buffering of a compensation capacitor. The amplifier circuit 900 is arrangement in a manner similar to that of the amplifier circuit 100 of FIG. 1. In the example of FIG. 9, a buffer 902 is positioned in the second feedback path 912. The buffer 902 may be constructed from any suitable material or components. In some examples, the buffer 902 is a unity gain buffer amplifier including an operational amplifier, or other suitable differential amplifier, with negative feedback. The buffer 902 directed from the output node 120 to the intermediate node 118. In this arrangement, the buffer 902 may block any feedforward current between the intermediate node 118 and the output node 120. This may further improve the settling time of the amplifier circuit 900 when the amplifier circuit 900 is powered-on.

Figure 10:
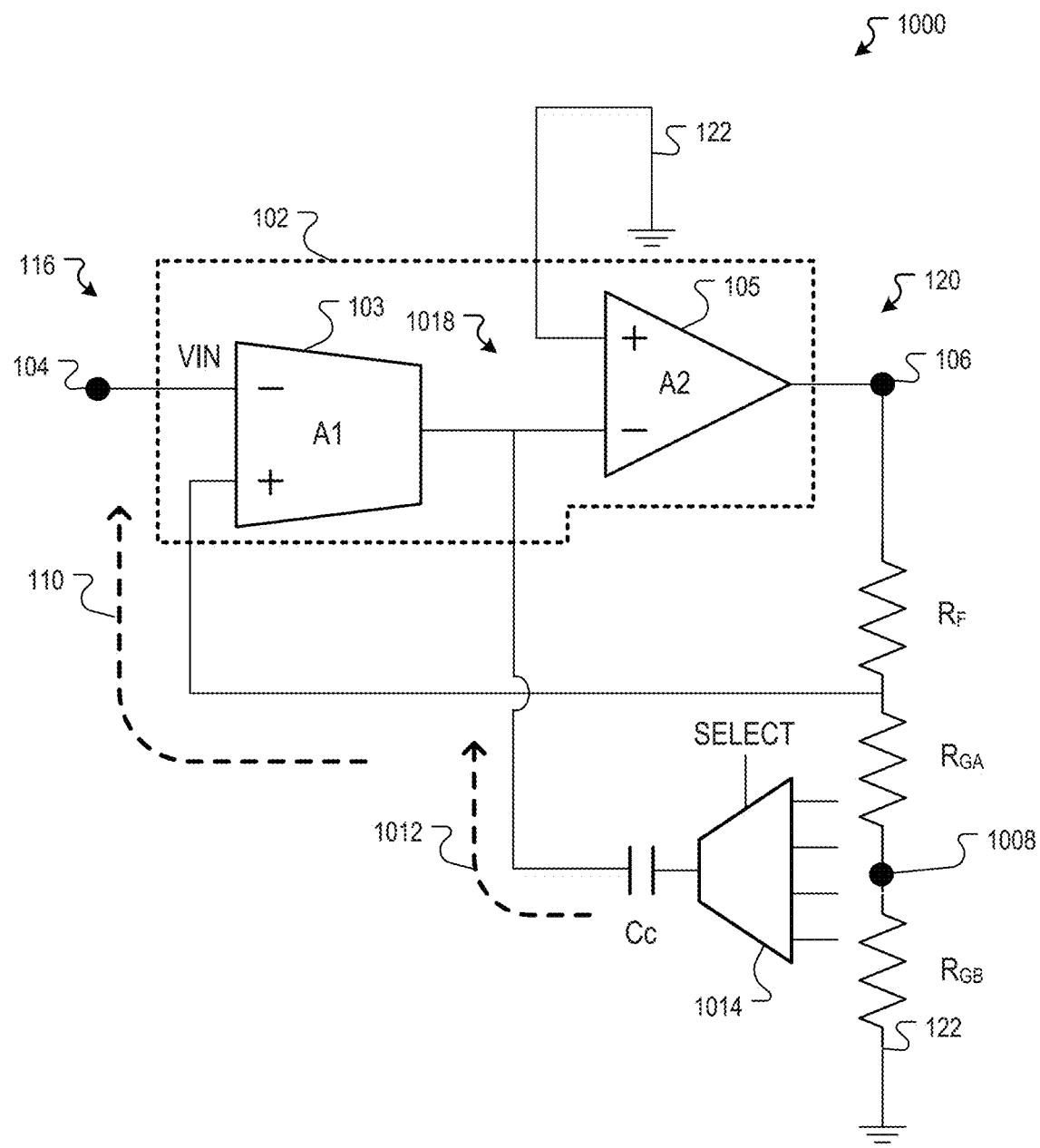
FIG. 10 is a diagram showing another example of a bandwidth-compensated amplifier circuit including a multi-stage amplifier.

FIG. 10 is a diagram showing another example of a bandwidth-compensated amplifier circuit 1000 including a multi-stage amplifier. The example bandwidth-compensated amplifier circuit 1000 of FIG. 10 may be similar to the bandwidth-compensated amplifier circuit 100 of FIG. 1. The circuit 1000 of FIG. 10, however, includes a second feedback path 1012 that includes the feedback resistance $R_F$ and a portion $R_{GA}$ of the gain resistance. A switching circuit 1014 is configurable to a state that electrically couples the compensation capacitor to a tap point 1008 at the gain resistance such that the gain resistance is separated into two portions $R_{GA}$ and $R_{GB}$. In some examples, the switching circuit 1014 may have one or more states in which the compensation capacitor is electrically coupled to tap points on the gain resistance, such as the tap point 1008 and one or more states in which the compensation capacitor is electrically coupled to tap points on the feedback resistance, such as the tap point 108 shown in FIG. 1.

Figure 11:
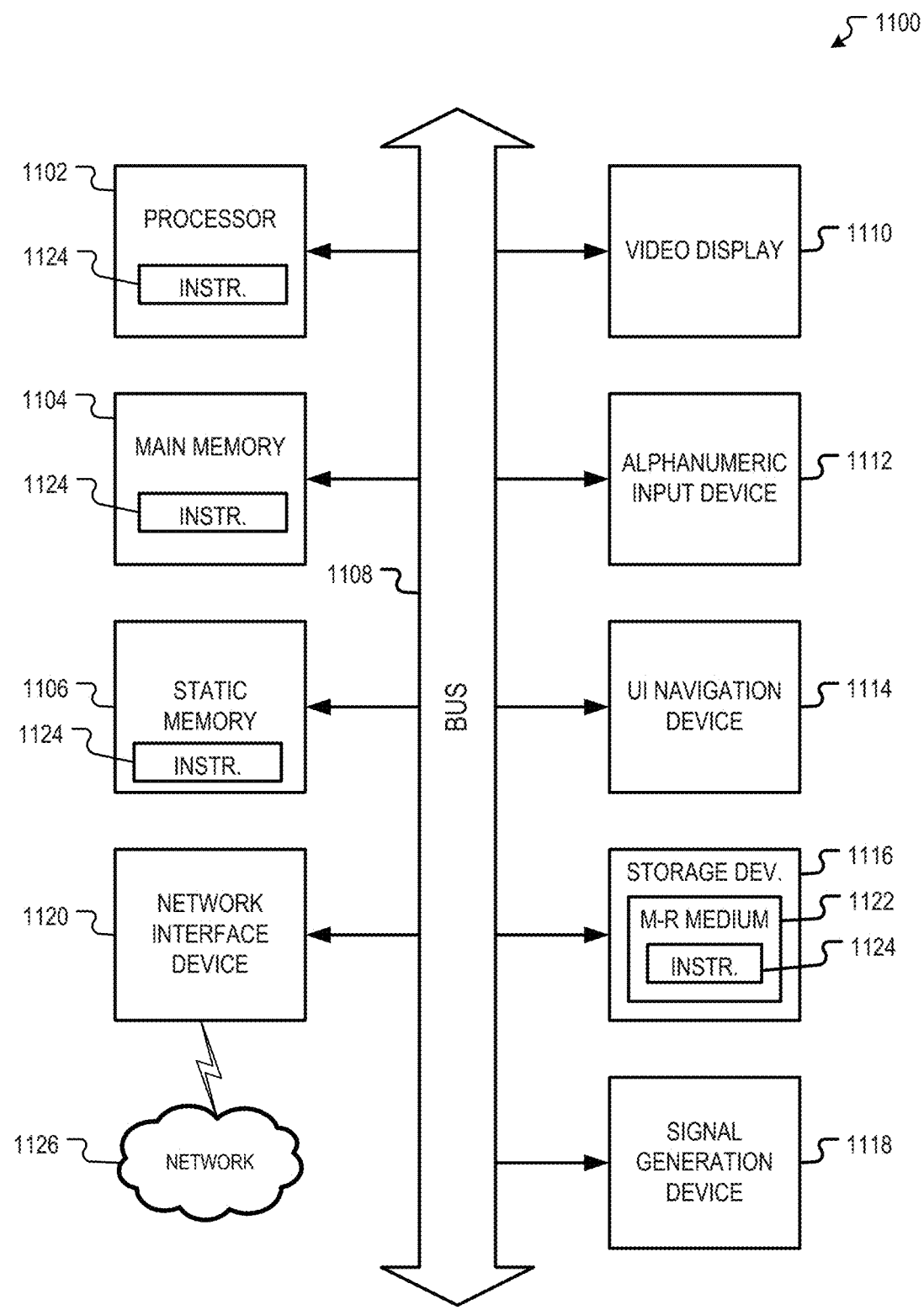
FIG. 11 is a block diagram illustrating a computing device hardware architecture, within which a set or sequence of instructions can be executed to cause a machine to perform examples of any one of the methodologies discussed herein.

FIG. 11 is a block diagram illustrating a computing device hardware architecture 1100, within which a set or sequence of instructions can be executed to cause a machine to perform examples of any one of the methodologies discussed herein. For example, the architecture 1100 may describe one or more processors or other computing devices that may be used to implement the control circuit 302, 602 or to execute the process flow 400 and 700 described herein. The architecture 1100 may operate as a standalone device or may be connected (e.g., networked) to other machines. In a networked deployment, the architecture 1100 may operate in the capacity of either a server or a client machine in server-client network environments, or it may act as a peer machine in peer-to-peer (or distributed) network environments. The architecture 1100 can be implemented in an embedded system, a personal computer (PC), a tablet PC, a hybrid tablet, a set-top box (STB), a personal digital assistant (PDA), a mobile telephone, a web appliance, a network router, a network switch, a network bridge, or any machine capable of executing instructions (sequential or otherwise) that specify operations to be taken by that machine.

The example architecture 1100 includes a processor unit 1102 comprising at least one processor (e.g., a central processing unit (CPU), a graphics processing unit (GPU), or both, processor cores, compute nodes). The architecture 1100 may further comprise a main memory 1104 and a static memory 1106, which communicate with each other via a link 1108 (e.g., a bus). The architecture 1100 can further include a video display unit 1110, an input device 1112 (e.g., a keyboard), and a UI navigation device 1114 (e.g., a mouse). In some examples, the video display unit 1110, input device 1112, and UI navigation device 1114 are incorporated into a touchscreen display. The architecture 1100 may additionally include a storage device 1116 (e.g., a drive unit), a signal generation device 1118 (e.g., a speaker), a network interface device 1120, and one or more sensors (not shown), such as a Global Positioning System (GPS) sensor, compass, accelerometer, or other sensor.

In some examples, the processor unit 1102 or another suitable hardware component may support a hardware interrupt. In response to a hardware interrupt, the processor unit 1102 may pause its processing and execute an ISR, for example, as described herein.

The storage device 1116 includes a machine-readable medium 1122 on which is stored one or more sets of data structures and instructions 1124 (e.g., software) embodying or used by any one or more of the methodologies or functions described herein. The instructions 1124 can also reside, completely or at least partially, within the main memory 1104, within the static memory 1106, and/or within the processor unit 1102 during execution thereof by the architecture 1100, with the main memory 1104, the static memory 1106, and the processor unit 1102 also constituting machine-readable media.

Executable Instructions and Machine-Storage Medium

The various memories (i.e., 1104, 1106, and/or memory of the processor unit(s) 1102) and/or the storage device 1116 may store one or more sets of instructions and data structures (e.g., the instructions 1124) embodying or used by any one or more of the methodologies or functions described herein. These instructions, when executed by the processor unit(s) 1102, cause various operations to implement the disclosed examples.

As used herein, the terms "machine-storage medium," "device-storage medium," and "computer-storage medium" (referred to collectively as "machine-storage medium") mean the same thing and may be used interchangeably. The terms refer to a single or multiple storage devices and/or media (e.g., a centralized or distributed database, and/or associated caches and servers) that store executable instructions and/or data, as well as cloud-based storage systems or storage networks that include multiple storage apparatus or devices. The terms shall accordingly be taken to include, but not be limited to, solid-state memories, and optical and magnetic media, including memory internal or external to processors. Specific examples of machine-storage media, computer-storage media, and/or device-storage media include non-volatile memory, including by way of example semiconductor memory devices, e.g., erasable programmable read-only memory (EPROM), electrically erasable programmable read-only memory (EEPROM), field-programmable gate array (FPGA), and flash memory devices; magnetic disks such as internal hard disks and removable disks: magneto-optical disks; and CD-ROM and DVD-ROM disks. The terms "machine-storage media," "computer-storage media," and "device-storage media" specifically exclude carrier waves, modulated data signals, and other such media, at least some of which are covered under the term "signal medium" discussed below.

Signal Medium

The term "signal medium" or "transmission medium" shall be taken to include any form of modulated data signal, carrier wave, and so forth. The term "modulated data signal" means a signal that has one or more of its characteristics set or changed in such a manner as to encode information in the signal.

Computer-Readable Medium

The terms "machine-readable medium," "computer-readable medium" and "device-readable medium" mean the same thing and may be used interchangeably in this disclosure. The terms are defined to include both machine-storage media and signal media. Thus, the terms include both storage devices/media and carrier waves/modulated data signals.

The instructions 1124 can further be transmitted or received over a communications network 1126 using a transmission medium via the network interface device 1120 using any one of a number of well-known transfer protocols (e.g., Hypertext Transfer Protocol (HTTP)). Examples of communication networks include a local area network (LAN), a wide area network (WAN), the Internet, mobile telephone networks, plain old telephone service (POTS) networks, and wireless data networks (e.g., Wi-Fi, 3G, 4G Long-Term Evolution (LTE)/LTE-A, 5G, or WiMAX networks).

VARIOUS NOTES & EXAMPLES

Example 1 is a frequency-compensated amplifier circuit, comprising: a first multi-stage amplifier comprising a first amplifier input node, a first amplifier output node, and a first amplifier intermediate node: a first feedback path between the first amplifier input node and the first amplifier output node, the first feedback path comprising a feedback resistance; a gain resistance electrically coupled to the feedback resistance; a second feedback path between the first amplifier intermediate node and a the amplifier output node, the second feedback path comprising a first capacitor and a resistance portion; and a first switch circuit electrically coupled to the first capacitor and to the feedback resistance, the first switch circuit having a plurality of states including a first state in which the first capacitor is coupled to a first tap point and the resistance portion has a first value and a second state in which the first capacitor is coupled to a second tap point and the resistance portion has a second value different than the first value.

In Example 2, the subject matter of Example 1 optionally includes a control circuit configured to selectively set the first switch circuit to the first state or to the second state.

In Example 3, the subject matter of Example 2 optionally includes the control circuit being configured to select the first state or the second state for the first switch circuit using an indication of a gain of the amplifier circuit.

In Example 4, the subject matter of any one or more of Examples 1-3 optionally includes a gain switch circuit electrically coupled to the first amplifier input node and to the gain resistance, the gain switch circuit having a first state in which the first amplifier input node is coupled to a first tap point of the gain resistance and a second state in which the first amplifier input node is coupled to a second tap point of the gain resistance different than the first tap point.

In Example 5, the subject matter of any one or more of Examples 1-4 optionally includes a second multi-stage amplifier comprising a second amplifier input node, a second amplifier output node, and a second amplifier intermediate node; a third feedback path between the second amplifier input node and the second amplifier output node, the third feedback path comprising a second feedback resistance; a fourth feedback path between the second amplifier output node and the second amplifier intermediate node, the fourth feedback path comprising a second capacitor and a second resistance portion; a second switch circuit electrically coupled to the second capacitor and to the second feedback resistance, the second switch circuit having a first state in which the second capacitor is coupled to a third tap point and the second resistance portion has a third value, the second switch circuit also having a second state in which the second capacitor is coupled to a fourth tap point and the second resistance portion has a fourth value different than the third value; and a differential amplifier, the first amplifier output node being electrically coupled to a non-inverting input of the differential amplifier, the second amplifier output node being electrically coupled to an inverting input of the differential amplifier.

In Example 6, the subject matter of Example 5 optionally includes the gain resistance being electrically coupled between the feedback resistance and the second feedback resistance.

In Example 7, the subject matter of any one or more of Examples 1-6 optionally includes a control circuit, the control circuit configured to perform operations comprising: powering-up the amplifier circuit; configuring the first switch circuit to the first state to set a bandwidth of the amplifier circuit to a first bandwidth value; and after waiting a first time period, configuring the first switch circuit to the second state to set a bandwidth of the amplifier circuit to a second bandwidth value less than the first bandwidth value.

In Example 8, the subject matter of Example 7 optionally includes the operations further comprising, after waiting a second time period, powering down the amplifier circuit.

In Example 9, the subject matter of any one or more of Examples 1-8 optionally includes an input node of the first multi-stage amplifier being electrically coupled to a sensor.

In Example 10, the subject matter of any one or more of Examples 1-9 optionally includes the first amplifier intermediate node comprising a second stage non-inverting input, and a second stage inverting input, the second feedback path being between the output node and the first stage inverting input.

In Example 11, the subject matter of any one or more of Examples 1-10 optionally includes the second feedback path further comprising a buffer directed from the output node to the intermediate node.

In Example 12, the subject matter of any one or more of Examples 1-11 optionally includes the first tap point being a tap point of the feedback resistance.

In Example 13, the subject matter of any one or more of Examples 1-12 optionally includes the second tap point being a tap point of the gain resistance.

Example 14 is a method of operating an amplifier, the amplifier comprising a first feedback path comprising a feedback resistance electrically coupled between an amplifier input node and an amplifier output node; a gain resistance electrically to the feedback resistance; and a second feedback path between a first amplifier intermediate node and the amplifier output node, the second feedback path comprising a capacitor and a resistance portion, the method comprising: configuring a first switch circuit from a first state in which the capacitor is coupled to a first tap point and the resistance portion has a first value to a second state in which the capacitor is coupled to a second tap point and the resistance portion has a second value different than the first value; providing a first feedback signal derived from the amplifier output node to the amplifier input node via the first feedback path; and providing a second feedback signal derived from the amplifier output node to an amplifier intermediate node via the second feedback path.

In Example 15, the subject matter of Example 14 optionally includes selecting the first portion of the feedback resistance to be coupled into the second feedback path using a gain of the amplifier.

In Example 16, the subject matter of any one or more of Examples 14-15 optionally includes configuring a gain switch circuit to switch a first portion of a gain resistance into the first feedback path.

In Example 17, the subject matter of any one or more of Examples 14-16 optionally includes powering-up the amplifier; and after waiting a first time period, configuring the first switch circuit to electrically couple a second portion of the feedback resistance into the second feedback path, the second portion of the feedback resistance being smaller than the first portion of the feedback resistance.

In Example 18, the subject matter of Example 17 optionally includes receiving a sensor input signal from a sensor at the amplifier input node; and after receiving the sensor input signal, powering-down the amplifier.

In Example 19, the subject matter of any one or more of Examples 17-18 optionally includes the second node being the first amplifier output node.

Example 20 is a frequency-compensated amplifier system comprising: a first multi-stage amplifier comprising a first amplifier input node, a first amplifier output node, and a first amplifier intermediate node; a first feedback path between the first amplifier input node and the first amplifier output node, the first feedback path comprising a feedback resistance; a second feedback path between the first amplifier output node and the first amplifier intermediate node, the second feedback path comprising a first capacitor and a resistance portion; means for modifying the resistance portion of the second feedback path; means for providing a first feedback signal derived from the amplifier output node to the amplifier input node via the first feedback path; and means for providing a second feedback signal derived from the amplifier output node to an amplifier intermediate node via the second feedback path.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Geometric terms, such as "parallel", "perpendicular", "round", or "square", are not intended to require absolute mathematical precision, unless the context indicates otherwise. Instead, such geometric terms allow for variations due to manufacturing or equivalent functions. For example, if an element is described as "round" or "generally round," a component that is not precisely circular (e.g., one that is slightly oblong or is a many-sided polygon) is still encompassed by this description.

The term "circuit" can include a dedicated hardware circuit, a general-purpose microprocessor, digital signal processor, or other processor circuit, and may be structurally configured from a general purpose circuit to a specialized circuit such as using firmware or software.

Any one or more of the techniques (e.g., methodologies) discussed herein may be performed on a machine. In various embodiments, the machine may operate as a standalone device or may be connected (e.g., networked) to other machines. In a networked deployment, the machine may operate in the capacity of a server machine, a client machine, or both in server-client network environments. In an example, the machine may act as a peer machine in peer-to-peer (P2P) (or other distributed) network environment. The machine may be a personal computer (PC), a tablet PC, a set-top box (STB), a personal digital assistant (PDA), a mobile telephone, a web appliance, a network router, switch or bridge, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, may include, or may operate by, logic or a number of components, or mechanisms. Circuit sets are a collection of circuits implemented in tangible entities that include hardware (e.g., simple circuits, gates, logic, etc.). Circuit set membership may be flexible over time and underlying hardware variability. Circuit sets include members that may, alone or in combination, perform specified operations when operating. In an example, hardware of the circuit set may be immutably designed to carry out a specific operation (e.g., hardwired). In an example, the hardware of the circuit set may include variably connected physical components (e.g., execution units, transistors, simple circuits, etc.) including a computer readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions can enable embedded hardware (e.g., the execution units or a loading mechanism) to create members of the circuit set in hardware via the variable connections to carry out portions of the specific operation when in operation. Accordingly, the computer readable medium is communicatively coupled to the other components of the circuit set member when the device is operating. In an example, any of the physical components may be used in more than one member of more than one circuit set. For example, under operation, execution units may be used in a first circuit of a first circuit set at one point in time and reused by a second circuit in the first circuit set, or by a third circuit in a second circuit set at a different time.

Particular implementations of the systems and methods described herein may involve use of a machine (e.g., computer system) that may include a hardware processor (e.g., a central processing unit (CPU), a graphics processing unit (GPU), a hardware processor core, or any combination thereof), a main memory and a static memory, some or all of which may communicate with each other via an interlink (e.g., bus). The machine may further include a display unit, an alphanumeric input device (e.g., a keyboard), and a user interface (UI) navigation device (e.g., a mouse). In an example, the display unit, input device and UI navigation device may be a touch screen display. The machine may additionally include a storage device (e.g., drive unit), a signal generation device (e.g., a speaker), a network interface device, and one or more sensors, such as a global positioning system (GPS) sensor, compass, accelerometer, or other sensor. The machine may include an output controller, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The storage device may include a machine readable medium on which is stored one or more sets of data structures or instructions (e.g., software) embodying or utilized by any one or more of the techniques or functions described herein. The instructions may also reside, completely or at least partially, within the main memory, within static memory, or within the hardware processor during execution thereof by the machine. In an example, one or any combination of the hardware processor, the main memory, the static memory, or the storage device may constitute machine readable media.

While the machine readable medium can include a single medium, the term "machine readable medium" may include a single medium or multiple media (e.g., a centralized or distributed database, and/or associated caches and servers) configured to store the one or more instructions.

The term "machine readable medium" may include any medium that is capable of storing, encoding, or carrying instructions for execution by the machine and that cause the machine to perform any one or more of the techniques of the present disclosure, or that is capable of storing, encoding or carrying data structures used by or associated with such instructions. Non-limiting machine readable medium examples may include solid-state memories, and optical and magnetic media. In an example, a massed machine readable medium comprises a machine readable medium with a plurality of particles having invariant (e.g., rest) mass. Accordingly, massed machine-readable media are not transitory propagating signals. Specific examples of massed machine readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The instructions may further be transmitted or received over a communications network using a transmission medium via the network interface device utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example, the network interface device may include one or more physical jacks (e.g., Ethernet, coaxial, or phone jacks) or one or more antennas to connect to the communications network. In an example, the network interface device may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding or carrying instructions for execution by the machine, and includes digital or analog communications signals or other intangible medium to facilitate communication of such software.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A frequency-compensated amplifier circuit, comprising:
    a first multi-stage amplifier comprising a first amplifier input node, a first amplifier output node, and a first amplifier intermediate node;
    a first feedback path between the first amplifier input node and the first amplifier output node, the first feedback path comprising a feedback resistance;
    a gain resistance electrically coupled to the feedback resistance;
    a second feedback path between the first amplifier intermediate node and the first amplifier output node, the second feedback path comprising a first capacitor and a resistance portion; and
    a first switch circuit electrically coupled to the first capacitor and to the feedback resistance, the first switch circuit having a plurality of states including a first state in which the first capacitor is coupled to a first tap point and the resistance portion has a first value and a second state in which the first capacitor is coupled to a second tap point and the resistance portion has a second value different than the first value.

2. The amplifier circuit of claim 1, further comprising a control circuit configured to selectively set the first switch circuit to the first state or to the second state.

3. The amplifier circuit of claim 2, the control circuit being configured to select the first state or the second state for the first switch circuit using an indication of a gain of the amplifier circuit.

4. The amplifier circuit of claim 1, further comprising a gain switch circuit electrically coupled to the first amplifier input node and to the gain resistance, the gain switch circuit having a first state in which the first amplifier input node is coupled to a first tap point of the gain resistance and a second state in which the first amplifier input node is coupled to a second tap point of the gain resistance different than the first tap point.

5. The amplifier circuit of claim 1, further comprising:
    a second multi-stage amplifier comprising a second amplifier input node, a second amplifier output node, and a second amplifier intermediate node;
    a third feedback path between the second amplifier input node and the second amplifier output node, the third feedback path comprising a second feedback resistance;
    a fourth feedback path between the second amplifier output node and the second amplifier intermediate node, the fourth feedback path comprising a second capacitor and a second resistance portion;
    a second switch circuit electrically coupled to the second capacitor and to the second feedback resistance, the second switch circuit having a first state in which the second capacitor is coupled to a third tap point and the second resistance portion has a third value, the second switch circuit also having a second state in which the second capacitor is coupled to a fourth tap point and the second resistance portion has a fourth value different than the third value; and
    a differential amplifier, the first amplifier output node being electrically coupled to a non-inverting input of the differential amplifier, the second amplifier output node being electrically coupled to an inverting input of the differential amplifier.

6. The amplifier circuit of claim 5, the gain resistance being electrically coupled between the feedback resistance and the second feedback resistance.

7. The amplifier circuit of claim 1, further comprising a control circuit, the control circuit configured to perform operations comprising:
    powering-up the amplifier circuit;
    configuring the first switch circuit to the first state to set a bandwidth of the amplifier circuit to a first bandwidth value; and
    after waiting a first time period, configuring the first switch circuit to the second state to set a bandwidth of the amplifier circuit to a second bandwidth value less than the first bandwidth value.

8. The amplifier circuit of claim 7, the operations further comprising, after waiting a second time period, powering down the amplifier circuit.

9. The amplifier circuit of claim 1, an input node of the first multi-stage amplifier being electrically coupled to a sensor.

10. The amplifier circuit of claim 1, the first amplifier intermediate node comprising a second stage non-inverting input, and a second stage inverting input, the second feedback path being between the first amplifier output node and the second stage inverting input.

11. The amplifier circuit of claim 1, the second feedback path further comprising a buffer directed from the first amplifier output node to the first amplifier intermediate node.

12. The amplifier circuit of claim 1, the first tap point being a tap point of the feedback resistance.

13. The amplifier circuit of claim 1, the second tap point being a tap point of the gain resistance.

14. A method of operating an amplifier, the amplifier comprising a first feedback path comprising a feedback resistance electrically coupled between an amplifier input node and an amplifier output node; a gain resistance electrically to the feedback resistance; and a second feedback path between a first amplifier intermediate node and the amplifier output node, the second feedback path comprising a capacitor and a resistance portion, the method comprising:
- configuring a first switch circuit from a first state in which the capacitor is coupled to a first tap point and the resistance portion has a first value to a second state in which the capacitor is coupled to a second tap point and the resistance portion has a second value different than the first value;
- providing a first feedback signal derived from the amplifier output node to the amplifier input node via the first feedback path; and
- providing a second feedback signal derived from the amplifier output node to an amplifier intermediate node via the second feedback path.

15. The method of claim 14, further comprising selecting the first portion of the feedback resistance to be coupled into the second feedback path using a gain of the amplifier.

16. The method of claim 14, further comprising configuring a gain switch circuit to switch a first portion of a gain resistance into the first feedback path.

17. The method of claim 14, further comprising:
- powering-up the amplifier; and
- after waiting a first time period, configuring the first switch circuit to electrically couple a second portion of the feedback resistance into the second feedback path, the second portion of the feedback resistance being smaller than the first portion of the feedback resistance.

18. The method of claim 17, further comprising:
- receiving a sensor input signal from a sensor at the amplifier input node; and
- after receiving the sensor input signal, powering-down the amplifier.

* * * * *